US008102505B2

(12) United States Patent  
De Hoon

(10) Patent No.: US 8,102,505 B2
(45) Date of Patent: Jan. 24, 2012

(54) LITHOGRAPHIC APPARATUS COMPRISING A VIBRATION ISOLATION SUPPORT DEVICE

(75) Inventor: Cornelius Adrianus Lambertus De Hoon, Best (NL)

(73) Assignee: ASML Netherlands B.V., Veldhoven (NL)

( * ) Notice: Subject to any disclaimer, the term of this patent is extended or adjusted under 35 U.S.C. 154(b) by 323 days.

(21) Appl. No.: 11/725,560

(22) Filed: Mar. 20, 2007

(65) Prior Publication Data

US 2008/0230677 A1  Sep. 25, 2008

(51) Int. Cl.
G03B 27/32 (2006.01)
G03B 27/42 (2006.01)
G03B 27/58 (2006.01)
G03B 27/62 (2006.01)
F16C 17/00 (2006.01)
F16C 32/06 (2006.01)
H02K 41/02 (2006.01)

(52) U.S. Cl. ........... 355/53; 248/638; 355/72; 355/75; 355/77; 310/12.31; 384/8; 384/100

(58) Field of Classification Search .......... 248/638, 248/580, 693; 355/53, 55, 75, 77, 72; 250/492.2; 378/34; 310/12.31, 90.5; 384/7–9, 100, 384/144, 114

See application file for complete search history.

(56) References Cited

U.S. PATENT DOCUMENTS

| | | | |
|---|---|---|---|
| 5,729,521 A * | 3/1998 | Otsuka | 369/112.29 |
| 6,731,372 B2 | 5/2004 | Binnard et al. | |
| 6,873,404 B2 | 3/2005 | Korenaga | |
| 7,239,369 B2 | 7/2007 | Jacobs et al. | |
| 7,593,100 B2 | 9/2009 | Okita | |
| 7,817,243 B2 | 10/2010 | Heertjes et al. | |
| 2004/0000215 A1* | 1/2004 | Phillips et al. | 74/574 |
| 2004/0182310 A1* | 9/2004 | Kaeppeler | 117/200 |
| 2005/0224687 A1* | 10/2005 | Heertjes et al. | 248/638 |
| 2006/0203232 A1* | 9/2006 | Okita | 356/237.2 |
| 2008/0105069 A1* | 5/2008 | Binnard et al. | 74/16 |
| 2008/0174915 A1* | 7/2008 | Hipwell et al. | 360/234 |

FOREIGN PATENT DOCUMENTS

JP 56-017341 A 2/1981

(Continued)

OTHER PUBLICATIONS

English language Abstract of Japanese Patent Publication No. 56-017341 A, filed Feb. 19, 1981: 1 page.

(Continued)

Primary Examiner — Hung Henry Nguyen
Assistant Examiner — Colin Kreutzer
(74) Attorney, Agent, or Firm — Sterne, Kessler, Goldstein & Fox P.L.L.C

(57) ABSTRACT

A lithographic apparatus includes an illumination system configured to condition a radiation beam, a support constructed to support a patterning device capable of imparting the radiation beam with a pattern in its cross-section to form a patterned radiation beam, a substrate table constructed to hold a substrate, and a projection system configured to project the patterned radiation beam onto a target portion of the substrate. At least one vibration isolation support device can be provided for supporting an object of the apparatus. The object can be rotatably supported at the vibration isolation support device by way of a rotational support having a center of rotation. The rotational support can have its center of rotation located substantially at the center of gravity of the vibration isolation support device.

26 Claims, 5 Drawing Sheets

FOREIGN PATENT DOCUMENTS

| | | | |
|---|---|---|---|
| JP | 61-247027 | A | 11/1986 |
| JP | 07-285044 | A | 10/1995 |
| JP | 09-44880 | A | 2/1997 |
| JP | 11-195578 | A | 7/1999 |
| JP | 2003-022960 | A | 1/2003 |
| JP | 2004-087832 | A | 3/2004 |
| JP | 2004-525315 | A | 8/2004 |
| JP | 2004-289115 | A | 10/2004 |
| JP | 2005-297109 | A | 10/2005 |
| JP | 2005-315426 | A | 11/2005 |
| JP | 2006-086442 | A | 3/2006 |
| JP | 2006-253572 | A | 9/2006 |
| JP | 2007-042924 | A | 2/2007 |
| WO | WO 2006/078025 | A1 | 7/2006 |
| WO | WO 2008/129762 | A1 | 10/2008 |

OTHER PUBLICATIONS

English language Abstract of Japanese Patent Publication No. 61-247027 A, filed Nov. 4, 1986; 1 page.

English language Abstract of Japanese Patent Publication No. 07-285044 A, filed Oct. 31, 1995; 1 page.

English language Abstract of Japanese Patent Publication No. 11-195578 A, filed Jul. 21, 1999; 1 page.

English language Abstract of Japanese Patent Publication No. 2003-022960 A, filed Jan. 24, 2003; 1 page.

English language Abstract of Japanese Patent Publication No. 2004-087832 A, filed Mar. 18, 2004; 1 page.

English language Abstract of Japanese Patent Publication No. 2004-289115 A, filed Oct. 14, 2004; 1 page.

English language Abstract of Japanese Patent Publication No. 2005-297109 A, filed Oct. 27, 2005; 1 page.

English language Abstract of Japanese Patent Publication No. 2005-315426 A, filed Nov. 10, 2005; 1 page.

English language Abstract of Japanese Patent Publication No. 2006-086442 A, filed Mar. 30, 2006; 1 page.

English language Abstract of Japanese Patent Publication No. 2006-253572 A, filed Sep. 21, 2006; 1 page.

English language Abstract of Japanese Patent Publication No. 2007-042924 A, filed Feb. 15, 2007; 1 page.

English translation of Japanese Notice of Reasons for Rejection directed to related Japanese Patent Application No. 2008-063793, Japanese Patent Office, mailed Dec. 17, 2010; 5 pages.

* cited by examiner

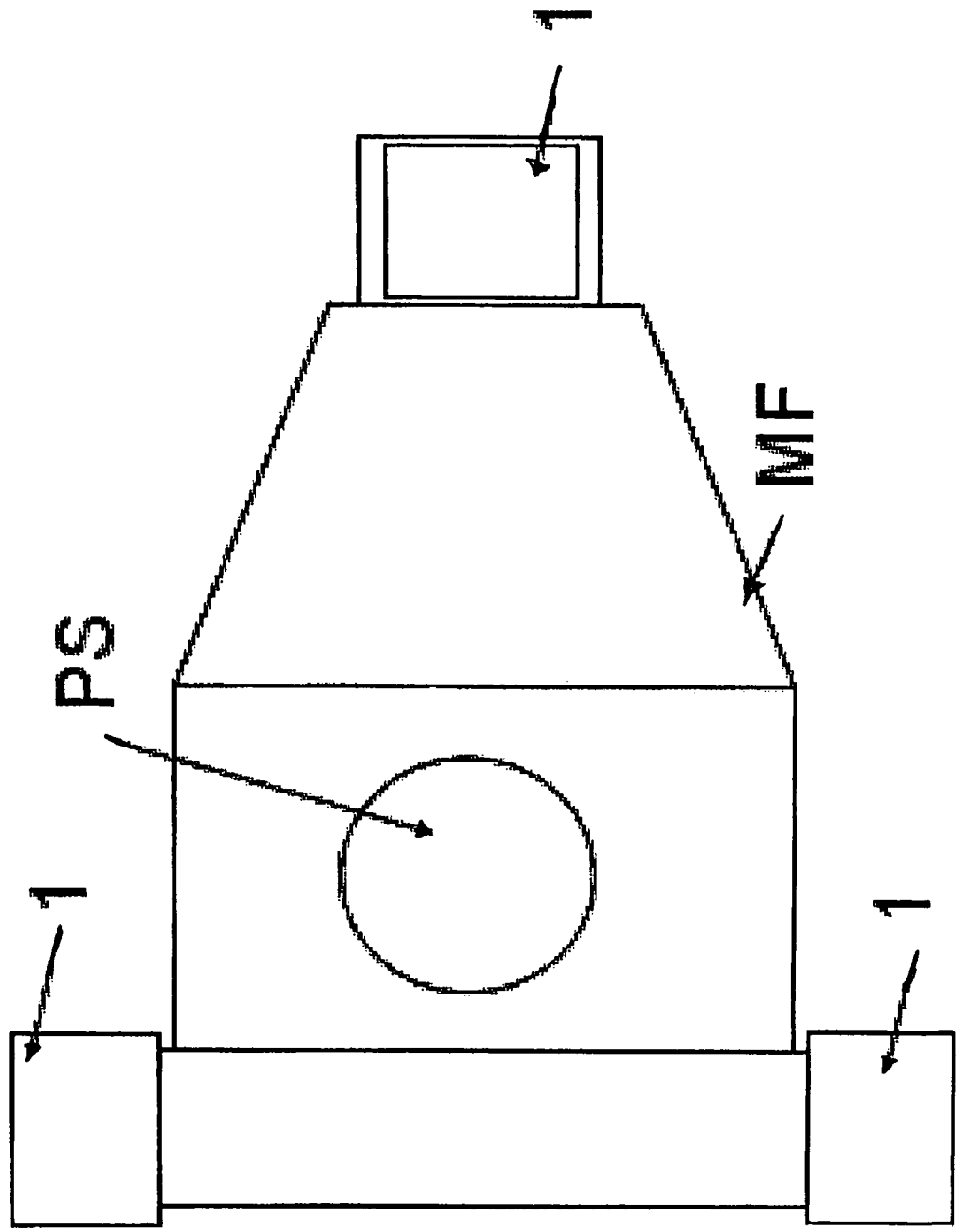

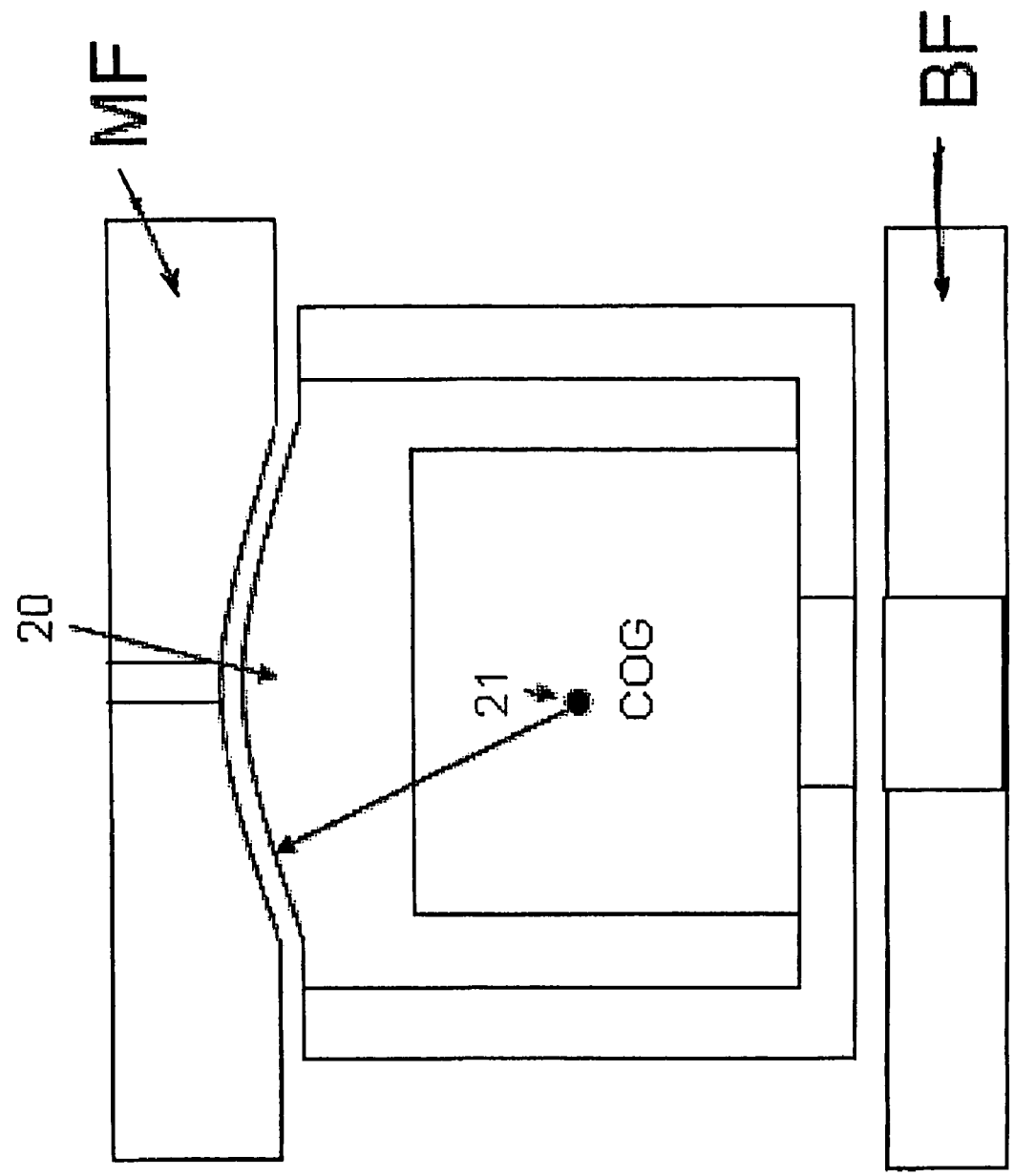

LITHOGRAPHIC APPARATUS COMPRISING A VIBRATION ISOLATION SUPPORT DEVICE

BACKGROUND

1. Field of the Invention

The present invention relates to an apparatus in general comprising a vibration isolation support device, a lithographic apparatus in particular comprising such a vibration isolation support, and to a vibration isolation support device itself.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The pattern to be transferred to the substrate may include very small structures. Any mechanical disturbance such as a vibrations or the like may result in an erroneous transfer rendering the substrate unusable. In order to minimize a transfer of vibrations and other mechanical disturbances from any external structure, such as a support structure or a floor, to the lithographic apparatus, in particular to a substrate table, a pattern support structure and/or a projection system thereof, it is known to employ one or more vibration isolation support devices to support the lithographic apparatus.

Such a vibration isolation support device supports the lithographic apparatus, i.e., at least partly compensates a gravitational force exerted thereon. Thus, the vibration isolation support device provides a mechanical connection between the lithographic apparatus and the external structure. Depending on a frequency of the vibration, a vibration present in the external structure may be (partly) damped by the isolation support device and/or (partly) transferred from the external structure to the lithographic apparatus. The amount of damping and/or transfer of a vibration of a certain frequency depends on a stiffness of the vibration isolation support device. A relatively small stiffness results in relatively high vibration isolation. Therefore, it is desirable to have a vibration isolation support device having a relatively small stiffness.

A well-known vibration isolation support device is an air mount. Such an air mount includes a gas chamber containing an amount of pressurized air and a moveable member partly positioned in the gas chamber. The pressure of the air exerts a support force on the movable member. An object such as a lithographic apparatus, or a part thereof, is supported on the movable member. The known air mount has such a stiffness that it is suitable to isolate vibrations above a predetermined frequency such that a pattern having a predetermined minimum feature size may be correctly transferred.

It is further known to disconnect rotational and translational vibrations between the external structure and the lithographic apparatus by means of the air mount. For example the translational disconnection might be achieved at the bottom of the air mount by means of a horizontal air bearing between the external structure and the air mount, whereas the rotational disconnection might be achieved at the top of the air mount by means of a pin connection between the lithographic apparatus and the air mount.

However, it has appeared that in a particular frequency area the isolation performances (transmissibility curve) of the air mount leave room for improvement. Typically, lithographic projection systems are particularly sensitive to vibrations with low frequencies in the range of 0 to 500 Hz. (the latter is not general). The desired degree of stability can therefore be very difficult to achieve.

SUMMARY

It is desirable to at least partially overcome the above disadvantages, or to provide a usable alternative for a vibration isolation support device.

According to an embodiment of the invention, there is provided a lithographic apparatus comprising an illumination system, a support, a substrate table, a projection system, and at least one vibration isolation support device. The illumination system is configured to condition a radiation beam. The support is constructed to support a patterning device which is capable of imparting the radiation beam with a pattern in its cross-section to form a patterned radiation beam. The substrate table is constructed to hold a substrate. The projection system is configured to project the patterned radiation beam onto a target portion of the substrate. The at least one vibration isolation support device is for supporting an object of the apparatus. The object is rotatably supported at the vibration isolation support device(s) by way of a rotational support having a center of rotation. The rotational support has its center of rotation located substantially at a center of gravity of the vibration isolation support device.

In another embodiment of the invention, there is provided an apparatus comprising at least one vibration isolation support device for supporting an object of the apparatus. The object is rotatably supported at the vibration isolation support device(s) by way of a rotational support having a center of rotation. The rotational support has its center of rotation located substantially at a center of gravity of the vibration isolation support device.

According to a further embodiment of the invention, there is provided a vibration isolation support device for supporting an object of an apparatus. The device comprises a rotational support having a center of rotation for rotatably supporting the object. The rotational support has its center of rotation located substantially at a center of gravity of the vibration isolation support device.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 schematically depicts a bottom view from part of the lithographic apparatus of FIG. 1;

FIG. 5 shows a third embodiment thereof.

DETAILED DESCRIPTION

Figure 1:
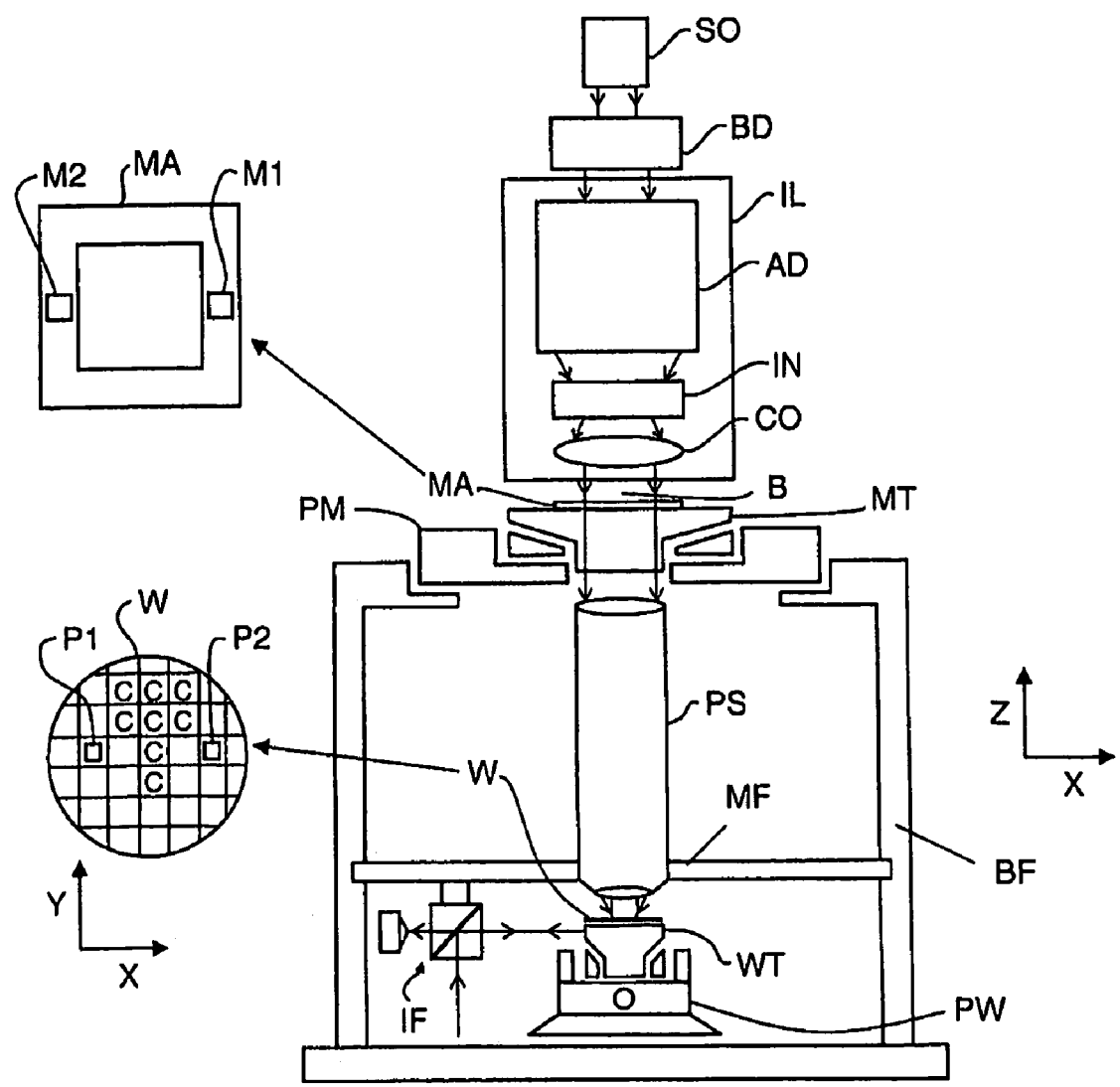
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device MA in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure MT supports, i.e. bears the weight of, the patterning device MA. It holds the patterning device MA in a manner that depends on the orientation of the patterning device MA, the design of the lithographic apparatus, and other conditions, such as for example whether or not the patterning device MA is held in a vacuum environment. The mask support structure MT can use mechanical, vacuum, electrostatic or other clamping techniques to hold the patterning device MA. The mask support structure MT may be a frame or a table, for example, which may be fixed or movable as required. The mask support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate W. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam B will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam B from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD including, for example, suitable directing mirrors and/or a beam expander. In other cases, the source SO may be an integral part of the lithographic apparatus, for example when the source SO is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may include various other components, such as an integrator IN and a condenser CO. The illuminator IL may be used to condition the radiation beam B, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As can be seen in FIG. 1, the lithographic apparatus comprises a metrology frame MF and a base frame BF. The base frame BF is mounted on a floor. The metrology frame MF as such has components of measuring equipment attached to it, as well as the projection system PS, the positioning devices PM and PW, etc. The metrology frame MF is vibration isolated from the base frame BF by means of three vibration isolation support devices. The vibration isolation support devices 1 are not shown in FIG. 1 but can schematically be seen in FIG. 2, which shows a bottom view from the lithographic apparatus of FIG. 1 at the position of its projection system PS and metrology frame MF.

Figure 3A:
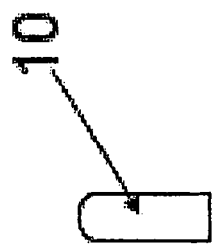
FIG. 3 schematically shows a first embodiment of the vibration isolation support device which can be used with the lithographic apparatus of FIG. 2.
Figure 3:
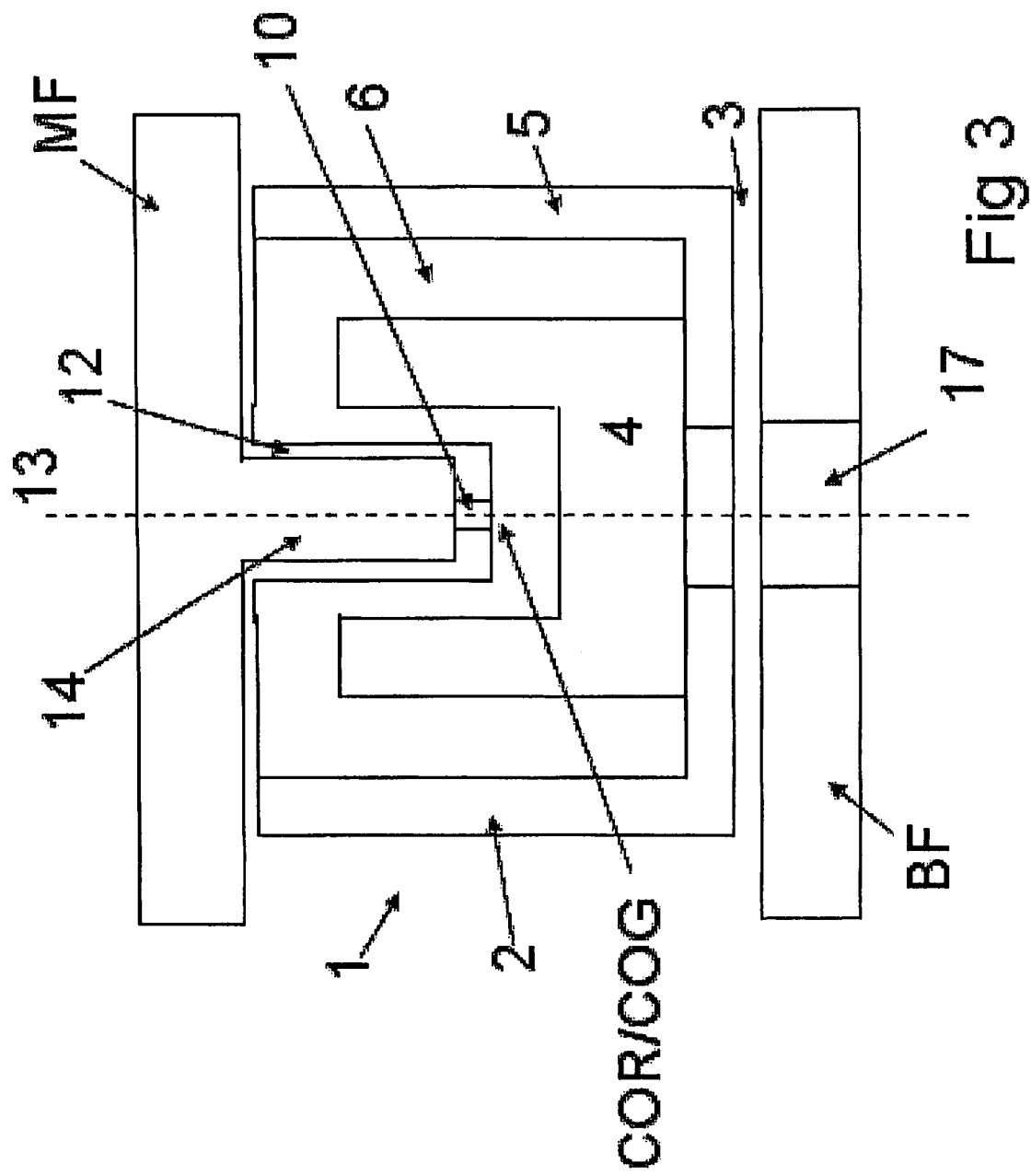

FIG. 3 shows an embodiment of one of the vibration isolation support devices 1 according to the present invention. The device 1 comprises a gas mount 2 for supporting the metrology frame MF. The gas mount 2 itself is supported by means of a gas bearing 3 on the base frame BF. The gas mount 2 comprises a piston-cylinder construction and contains an amount of gas, e.g. air, in a gas chamber 4 formed by gas chamber walls 5 and a movable member 6, which may move with respect to the gas chamber walls 5. Due to the pressure in the gas, a force is exerted on the movable member 6. This force may be employed to compensate a gravitational force exerted on the metrology frame MF.

The metrology frame MF is rotatably supported at the vibration isolation support devices 1 by means of a rotational support 10. With this, rotatably supported means that in this support all degrees of freedom are fixedly supported except the rotations, which are free. Thus the metrology frame MF has the freedom to rotate with respect to the rotational support 10. The rotational support 10 comprises a pin which at its bottom side is connected with the moveable member 6, and which at its top side has a rounded top surface (see the enlargement of FIG. 3a) upon which the metrology frame MF rests. The vibration isolation support device 1 has a center of gravity COG. The rotational support 10 has its center of rotation COR located substantially at the center of gravity COG of the gas mount 2, that is to say the rounded top surface has its rotation point located substantially at the center of gravity COG of the vibration isolation support device 1. This has the advantage that the isolation performances of the vibration isolation support devices are considerably improved. For example, horizontal forces are no longer injected in the metrology frame MF due to rotations of the gas mount 2 caused by rotations of the base frame BF. The gas mount 2 will automatically rotate around its center of gravity COG without introducing horizontal forces in the MF. Thus the transmissibility of rotations of the base frame BF towards translations of the metrology frame MF is advantageously reduced or eliminated. Besides this, the lowest gas mount resonance frequency increases and it is less/not perceivable anymore in the transmissibility because a rotation mode shape of the gas mount 2 does not lead to metrology frame movements. The advantageously reduced gas mount transmissibility leads to decreased movements of the metrology frame MF that might otherwise have been caused by movements of the base frame BF. Thus a better imaging can be achieved with the lithographic apparatus.

As can be seen in FIG. 3, the gas mount 2 is constructed such that the rounded top support surface of the rotational support 10 is located inside the vibration isolation support device 1. For this the moveable member 6 is provided with a recessed portion 12 around its central axis 13. Furthermore, the metrology frame MF is provided with a downwardly protruding support ear 14 which extends inside the recessed portion 12 in the direction of the center of gravity COG of the vibration isolation support device 1. The downwardly protruding support ear 14 is rotatably supported at the rotational support 10.

The gas bearing 3 is formed by a small slit between the base frame BF and the bottom of the gas mount 2. During operation this slit is provided with pressurized gas via a gas feed opening 17 in the base frame BF. The gas bearing 3 forms a translational support which is substantially rigid in the direction perpendicular to its translational direction. Advantageously, during operation, the gas mount 2 itself can also be provided with pressurized gas via the same gas feed opening 17 in the base frame BF.

Figure 4:
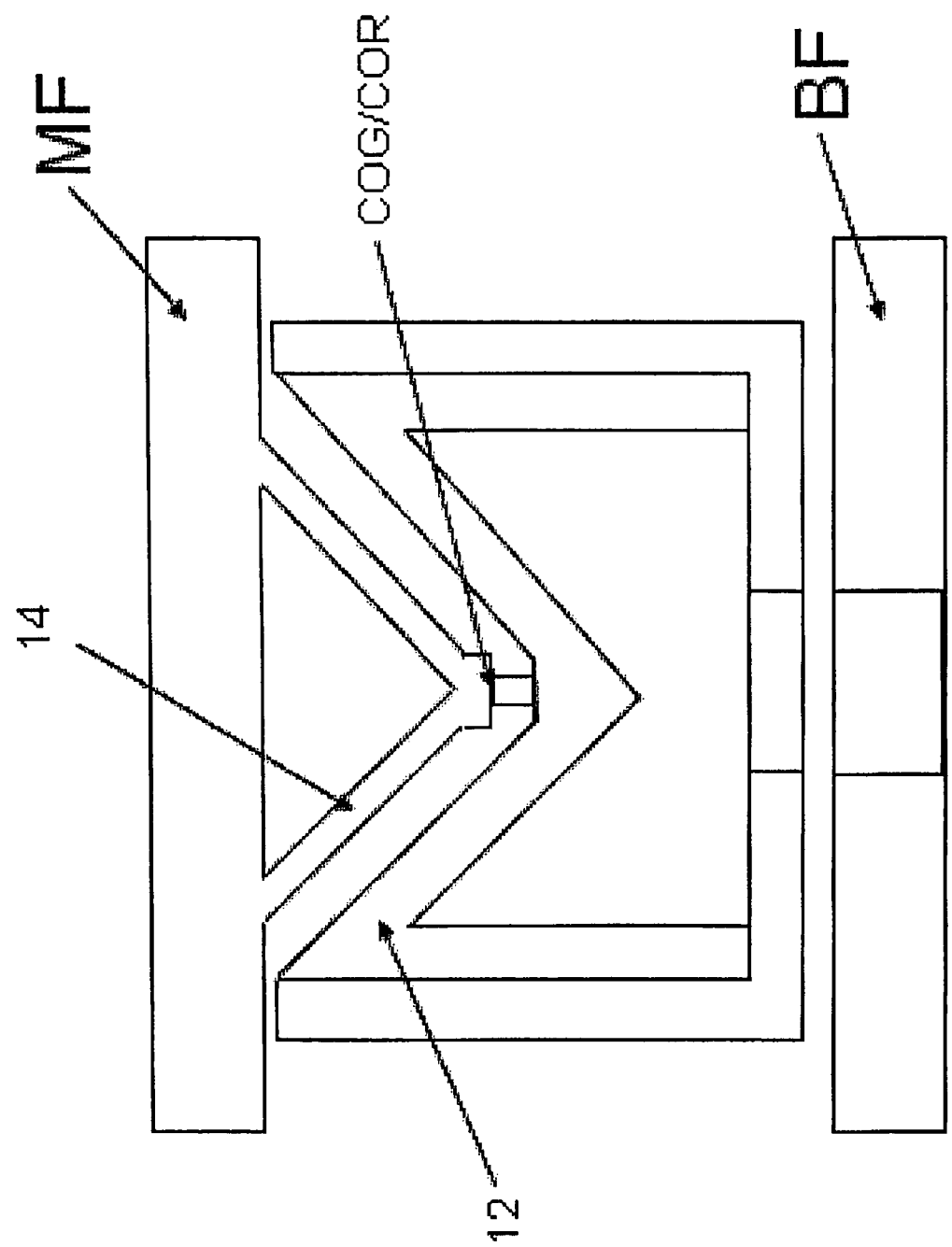
FIG. 4 shows a second embodiment thereof.

FIG. 4 shows an alternative embodiment in which the recess 12 in the vibration isolation support device 1 and also the support ear 14 of the metrology frame MF have a somewhat conical shape. Besides this, many variants are possible for this, including, for example, those having a center of rotation COR of the rotational support 10 of the vibration isolation support device 1 positioned substantially at the center of gravity COG of the vibration isolation support device 1.

FIG. 5 shows another example in which the vibration isolation support device 1 has a rounded support surface 20 which is located at the upper side of the gas mount 2. The rounded support surface 20 has center of curvature 21 which is located substantially in the center of gravity of the vibration isolation support device 1. The metrology frame MF is supported with a complementary concave recessed portion on top of the rounded support surface 20. In the embodiment shown, a gas bearing is provided in between the metrology frame MF and the support surface 20.

Besides the embodiments shown many variants are possible. For example another kind or rotational support might be used for achieving the rotational disconnection, like some kind of friction free pivotal connection. In the case of a pin shaped rotational support, the rotation point (center of rotation COR) can also be at the top thereof. For example because of deformations, that is where the actual rotation can take place. In that case, according to the invention, the center of gravity of the vibration isolation support device should also be located substantially at this rotation point on top of the rotational support. Instead of a gas bearing, another translational support might be used, such as, for example, flexible support columns between the vibration isolation support device 1 and the base frame BF. Also the translational disconnection might be provided at other positions, such as, for example, directly between the metrology frame MF and the vibration isolation support device 1, or at the same location where the rotational disconnection takes place. Besides a gas mount, it is also possible to use different types of vibration isolation support devices, such as, for example, some kind of bellows. The center of rotation of the rotational support does not need to lie exactly in the center of gravity of the vibration isolation support device 1. A considerable improvement can be achieved even if the center of gravity of the vibration isolation support device 1 is located merely in proximity to the center of rotation of the rotational support. The center of rotation, for example, can lie within a range of +/−30% of the total height of the vibration isolation support device 1, and/or 3-5 centimeters around the center of gravity.

The vibration isolation support device according to the invention might also be used to support other objects of the lithographic apparatus, such as, for example, an illuminator of the projection system PS which has its own actuator and which might be placed on separate vibration isolation support devices. The vibration isolation support device according to the invention can also be used outside the field of lithography, such as, for example, for supporting (part of) a microscope or any other object which needs to be supported free from vibrations from the outside world.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

What is claimed is:

1. A lithographic apparatus, comprising:
   an illumination system configured to condition a radiation beam;
   a support configured to support a patterning device, the patterning device configured to impart the radiation beam with a pattern in its cross-section to form a patterned radiation beam;
   a substrate table configured to hold a substrate;
   a projection system configured to project the patterned radiation beam onto a target portion of the substrate; and
   a vibration isolation support device having a center of gravity and a rotational support configured to support an object of the lithographic apparatus, the object having a center of rotation, wherein the vibration isolation support device is configured such that the center of rotation of the object is located at the rotational support and such that the center of rotation of the object is located substantially at the center of gravity of the vibration isolation support device.

2. The lithographic apparatus of claim 1, wherein the rotational support comprises a rounded surface on which the object is rotatably supported, the rounded surface having a center of curvature located substantially at the center of gravity of the vibration isolation support device.

3. The lithographic apparatus of claim 1, wherein a support surface of the rotational support is located inside the vibration isolation support device.

4. The lithographic apparatus of claim 1, wherein a support surface of the rotational support is located at an upper part of the vibration isolation support device.

5. The lithographic apparatus of claim 1, wherein the object is provided with a downwardly protruding support part that extends in a direction parallel to the center of gravity of the vibration isolation support device, said downwardly protruding support configured to be supported at the rotational support.

6. The lithographic apparatus of claim 1, wherein the vibration isolation support device comprises a translational support.

7. The lithographic apparatus of claim 6, wherein the translational support comprises a gas bearing and a gas feed for feeding pressurized gas to the gas bearing.

8. The lithographic apparatus of claim 1, wherein the vibration isolation support device comprises a gas mount having a gas chamber configured to contain an amount of pressurized gas and having a moveable gas mount member that partly delimits the gas chamber, wherein the gas mount is configured such that the pressure of the gas exerts a supporting force on the moveable gas mount member.

9. The lithographic apparatus of claim 8, wherein the gas mount comprises a piston-cylinder construction.

10. The lithographic apparatus of claim 1, wherein the object is a metrology frame.

11. The lithographic apparatus of claim 1, wherein the object is in physical contact with the vibration isolation support device.

12. The lithographic apparatus of claim 1, wherein the rotational support is configured such that the object can rotate relative to the rotational support device.

13. The lithographic apparatus of claim 12, wherein the rotational support is configured such that the object can rotate about three orthogonal axes.

14. An apparatus, comprising:
a vibration isolation support device having a center of gravity and a rotational support configured to support an object of the apparatus, the object having a center of rotation,
wherein the vibration isolation support device is configured such that the center of rotation of the object is located at the rotational support and such that the center of rotation of the object is located substantially at the center of gravity of the vibration isolation support device.

15. The apparatus of claim 14, wherein the object is in physical contact with the vibration isolation support device.

16. The apparatus of claim 14, wherein the rotational support is configured such that the object can rotate relative to the rotational support device.

17. The apparatus of claim 16, wherein the rotational support is configured such that the object can rotate about three orthogonal axes.

18. A vibration isolation support device having a center of gravity and for supporting an object of an apparatus, comprising:
a rotational support configured to support the object, the object having a center of rotation,
wherein the vibration isolation support device is configured such that the center of rotation of the object is located at the rotational support and such that the center of rotation of the object is located substantially at the center of gravity of the vibration isolation support device.

19. The vibration isolation support device of claim 18, wherein the object is in physical contact with the vibration isolation support device.

20. The vibration isolation support device of claim 18, wherein the rotational support is configured such that the object can rotate relative to the rotational support device.

21. The vibration isolation support device of claim 20, wherein the rotational support is configured such that the object can rotate about three orthogonal axes.

22. A vibration isolation support device having a center of gravity and for supporting an object of an apparatus, comprising:
a gas mount having a gas chamber configured to contain an amount of pressurized gas and having a moveable gas mount member that partly delimits the gas chamber, wherein the gas mount is configured such that the pressure of the gas exerts a supporting force on the moveable gas mount member; and
a rotational support configured to support the object, the object having a center of rotation,
wherein the gas mount and the rotational support are configured such that the center of rotation of the object is located at the rotational support and such that the center of rotation of the object is located substantially at the center of gravity of the vibration isolation support device.

23. The vibration isolation support device of claim 22 further comprising a translational support.

24. The vibration isolation support device of claim 23, wherein the translational support comprises a gas bearing and a gas feed for feeding pressurized gas to the gas bearing.

25. The vibration isolation support device of claim 22, wherein a support surface of the rotational support is located inside the vibration isolation support device.

26. The vibration isolation support device of claim 22, wherein the rotational support is configured such that the object can rotate relative to the rotational support device.

* * * * *